United States Patent
Huebner et al.

(10) Patent No.: US 6,773,956 B2
(45) Date of Patent: Aug. 10, 2004

(54) METHOD FOR CONTACT-CONNECTING A SEMICONDUCTOR COMPONENT

(75) Inventors: Holger Huebner, Baldham (DE); Vaidyanathan Kripesh, Singapore (SG)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/352,680

(22) Filed: Jan. 28, 2003

(65) Prior Publication Data

US 2003/0176054 A1 Sep. 18, 2003

Related U.S. Application Data

(63) Continuation of application No. PCT/EP01/08610, filed on Jul. 25, 2001.

(30) Foreign Application Priority Data

Jul. 28, 2000 (EP) .......................................... 00116427

(51) Int. Cl.$^7$ ............................................. H01L 21/44
(52) U.S. Cl. ....................... 438/106; 438/108; 438/111; 438/123; 438/612; 228/56.3; 228/262.6; 228/262.61
(58) Field of Search ................................ 438/106, 107, 438/108, 109, 110, 111, 119, 123, 612, 597; 228/56.3, 262.6, 262.61

(56) References Cited

U.S. PATENT DOCUMENTS

| | | | | |
|---|---|---|---|---|
| 3,839,727 A | * | 10/1974 | Hedzik et al. ................. 357/71 |
| 4,811,170 A | | 3/1989 | Pammer | |
| 4,834,794 A | * | 5/1989 | Yagi et al. ..................... 75/255 |
| 5,291,371 A | * | 3/1994 | Gruber et al. ............... 361/705 |
| 5,320,272 A | * | 6/1994 | Melton et al. ......... 228/180.21 |
| 5,391,514 A | * | 2/1995 | Gall et al. ................... 437/183 |
| 5,415,944 A | * | 5/1995 | Kazem-Goudarzi et al. ............................ 428/567 |
| 5,907,187 A | * | 5/1999 | Koiwa et al. ................ 257/737 |
| 5,928,404 A | * | 7/1999 | Paruchuri et al. .............. 75/255 |
| 5,442,145 A | * | 8/1995 | Imai et al. ................... 174/267 |
| 5,540,379 A | * | 7/1996 | Kazem-Goudarzi et al. ....................... 228/248.5 |
| 5,729,896 A | * | 3/1998 | Dalal et al. .................... 29/840 |
| 5,888,841 A | * | 3/1999 | Zynder ......................... 438/33 |

FOREIGN PATENT DOCUMENTS

| | | |
|---|---|---|
| DE | 195 31 158 A1 | 2/1997 |
| EP | 0 426 303 A3 | 5/1991 |
| EP | 0 426 303 A2 | 5/1991 |
| EP | 0 530 780 A1 | 3/1993 |

OTHER PUBLICATIONS

Morris, J. W. et al.: "Microstructure and Mechanical Properties of Sn–In and Sn–Bi Solders", JOM, US, Minerals, Metals and Materials Society, Warrendale, vol. 45, No. 7, Jul. 1993, pp. 25–27.

Rai, R.S. et al.: "Interfacial Reactions with Lead (Pb)–Free Solders", IEEE, 1995 Proceedings, 45th Electronic Components and Technology Conference, May 24, 1995, pp. 1197–1202.

*Primary Examiner*—Matthew Smith
*Assistant Examiner*—Renzo Rocchegiani
(74) *Attorney, Agent, or Firm*—Laurence A. Greenberg; Werner H. Stemer; Ralph E. Locher

(57) ABSTRACT

A solder metal made of a eutectic or stoichiometric composition including at least two metallic or semiconducting elements is applied to a contact (of the semiconductor component, brought into contact with the metal layer of a metallized film and alloyed by heating into the metal layer of the film, thereby producing an electrically conductive connection having a higher melting point. A solder metal that is particularly suitable for such a purpose is the $Bi_{22}In_{78}$ (melting point 73° C.), $Bi_{43}Sn_{57}$, or $In_{52}Sn_{48}$, or BiIn, or $BiIn_2$.

16 Claims, 1 Drawing Sheet

U.S. PATENT DOCUMENTS

| | | | | |
|---|---|---|---|---|
| 5,972,246 A | * | 10/1999 | Nikaidoh et al. | 252/512 |
| 6,130,476 A | * | 10/2000 | LaFontaine, Jr. et al. | 257/678 |
| 6,196,443 B1 | * | 3/2001 | DiGiacomo | 228/180.22 |
| 6,250,541 B1 | * | 6/2001 | Shangguan et al. | 228/208 |
| 6,388,185 B1 | * | 5/2002 | Fleurial et al. | 135/205 |
| 6,524,888 B2 | * | 2/2003 | Cokely et al. | 438/108 |

* cited by examiner

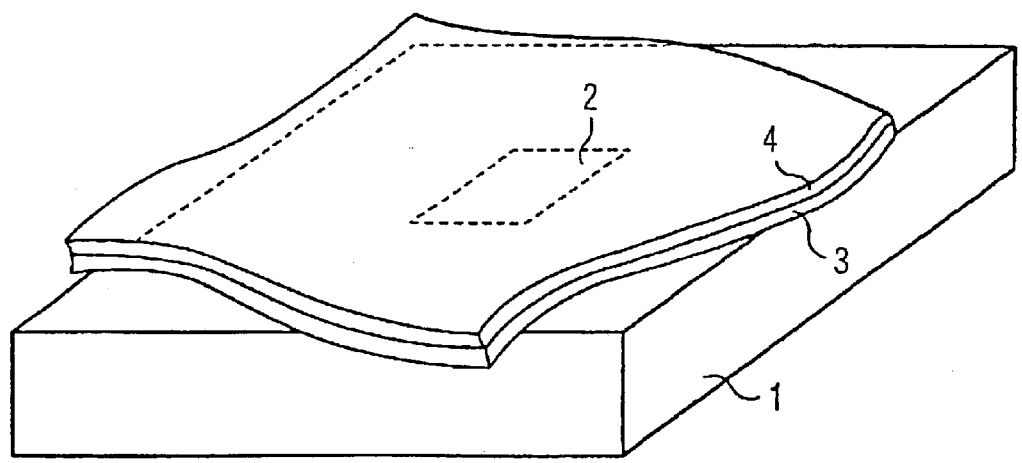

METHOD FOR CONTACT-CONNECTING A SEMICONDUCTOR COMPONENT

CROSS-REFERENCE TO RELATED APPLICATION

This application is a continuation of copending International Application No. PCT/EP01/08610, filed Jul. 25, 2001, which designated the United States and was not published in English.

BACKGROUND OF THE INVENTION

Field of the Invention

The present invention relates to a method for contact-connecting a semiconductor component to a metallization on a film.

With electrically conductive adhesives, electrically conductive connections can be produced even at a low processing temperature. However, for curing, many adhesives of this type actually need higher temperatures, at which the plastics material of a film is damaged or a metallization applied thereto is detached. Moreover, the electrical conductivity is insufficient for many applications, and the connection produced is sensitive to moisture. Particularly if a contact of an electronic component (e.g., an Si-IC Chip) is intended to be electrically conductively connected to a metal layer (e.g., made of copper or nickel) of a metallized plastic film, in the case of which the limit of thermal loadability is about 120° C. and in the case of which the applied metal layer is very thin (typically about 100 nm), it is difficult, with conductive adhesive, to produce a sufficiently lasting and readily conductive connection that cannot be detached without destroying the film.

SUMMARY OF THE INVENTION

It is accordingly an object of the invention to provide a method for contact-connecting a semiconductor component to a metallized plastic film that overcomes the hereinafore-mentioned disadvantages of the heretofore-known devices and methods of this general type and that can be performed at a temperature at which the film is not damaged and which yields a permanent electrically conductive connection of sufficient conductivity.

With the foregoing and other objects in view, there is provided, in accordance with the invention, a method for contact-connecting a semiconductor component to a film provided with a metal layer, including the steps of disposing a solder material between a contact of the semiconductor component and the metal layer of the film, the solder material containing at least two different substances selected from a group consisting of elementary metals and semiconductor materials and having a melting point at a temperature at which the film is not damaged, and subsequently causing the solder material to melt and thereafter solidify and, thereby, produce a permanent electrically conducted connection of a material having a melting point higher than the melting point of the disposed solder material.

In accordance with another mode of the invention, a solder material, preferably, a metal, made of at least two metallic or semiconducting chemical elements is applied to a contact of the semiconducting component or to the metal layer of the film at the location provided for a contact connection. The solder material is configured such that it has a melting point that lies below a critical temperature for the resistivity of the film, and that it forms, after melting, a material that, after solidification, has a higher melting point than the original solder material. The molten solder material is, preferably, configured such that it forms an alloy or intermetallic compound or phase with the metal of the metal layer of the film or with the metal of the contact of the semiconductor component. The melting point is, preferably, so high that, in the event of an attempt to melt the solder connection, the film would inevitably be damaged or at the very least the metal layer would be detached from the film and the entire configuration would, thus, become unusable.

A solder material that is particularly suitable for such a purpose is a composition—i.e., a blend of at least and, preferably, two components that form a mixture, an alloy, or a stoichiometric compound—whose proportions are chosen such that the composition lies at a eutectic point or at least in the vicinity of a eutectic point. Specifically, it holds true for such a choice of the composition that the melting point of the composition increases in the event of any change in the proportions of the components. When the solder material melts, an alloy or an intermetallic compound is produced that contains a proportion of the metal of the metal layer of the film or of the contact of the semiconductor component so that the composition of the material forming the electrically conductive connection differs from the eutectic of the original composition of the solder material to such a significant extent, that the melting point is considerably higher, in particular, above the temperatures that are safe for the film. In such a case, an approximately eutectic composition shall be defined as a composition having a melting point that differs from the eutectic temperature by at most 10° C.

In accordance with a further mode of the invention, a solder material is selected with which, in the melting and solidification step, one of an alloy and an intermetallic compound having a higher melting point is formed with a metal of the metal layer of the film.

In accordance with an added mode of the invention, the solder material, in the melting and solidification step, forms, with a metal of the metal layer of the film, one of an alloy and an intermetallic compound having a higher melting point than the melting point of the solder material.

In accordance with an additional mode of the invention, a solder material is utilized having a melting point at most 10° C. above a temperature of a eutectic composition of the substances contained in the solder material.

A material that is appropriate as a possible solder material, preferably, in conjunction with a metal layer of the film made of copper or nickel, is primarily a material containing bismuth (chemical symbol Bi). Eutectic or approximately eutectic (difference in temperature from the eutectic at most 10° C.) compositions that achieve what is desired are materials from the group of a composition including bismuth and indium, a composition including bismuth and tin, and a composition including indium and tin. The eutectic compositions of these materials in relative atomic masses are $Bi_{22}In_{78}$, $Bi_{43}Sn_{57}$, or $In_{52}Sn_{48}$. The material $Bi_{22}In_{78}$ forms a eutectic composition having the melting point of 72.7° C. A solder connection can, thus, be produced at approximately 80° C. The solder material $Bi_{22}In_{78}$ is applied, e.g., to the contact of the semiconductor component, which can be done by sputtering. The solder material, then, forms a thin layer on the contact. The layer is brought into contact with the metal layer of the film and, as required, kept under slight pressure. Through heating to a temperature above the melting point of the solder material, the solder material is melted and alloys with the metal of the metal layer of the film to form a material that forms an electrically conductive connection between the contact of the semiconductor component and the metal layer of the film that can be subjected to loading up to at least 270° C. With the use of a film whose thermal loadability extends up to a maximum of about 120° C., the connection can, therefore, be produced without difficulty at about 80° C. Afterwards, the connection can no longer be melted without destroying the film.

In accordance with yet another mode of the invention, a solder material is utilized including one of an intermetallic compound of one of BiIn and BiIn$_2$ and a phase of one of BiIn and BiIn$_2$.

In accordance with yet a further mode of the invention, the solder material is applied in the disposing step by electron beam vaporization onto one of the contact of the semiconductor component and the metal layer of the film.

In accordance with yet an added mode of the invention, electron beam vaporization is used to apply the solder material onto one of the contact of the semiconductor component and the metal layer of the film.

In accordance with yet an additional mode of the invention, the solder material is applied in the disposing step with a layer thickness limited in comparison with a thickness of the metal layer of the film to permit at least a portion of the metal layer of the film to remain unchanged after the melting and solidification step.

In accordance with a concomitant mode of the invention, there is provided the step of insuring that at least a portion of the metal layer of the film remains unchanged after the melting and solidification step by applying the solder material with a layer thickness limited in comparison with a thickness of the metal layer of the film.

Other features that are considered as characteristic for the invention are set forth in the appended claims.

Although the invention is illustrated and described herein as embodied in a method for contact-connecting a semiconductor component, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

The FIGURE of the drawing is a partially hidden perspective view of a semiconductor component configuration according to the invention.

DESCRIPTION OF THE PREFERRED EMBODIMENTS

Referring now to the single FIGURE of the drawing, it is seen that a semiconductor component 1 with a contact 2 and with a metal layer 3 of a film 4 that is provided on the contact. The dimensions of the film and of the component, the number and the dimensions of the contacts connected to the metallized film, and the number of layers that form the film and the metal layer are arbitrary.

To prevent the situation wherein, in the event of an excess of solder material a) the metal layer of the film alloys with the solder material in its entire thickness and, under certain circumstances, detaches from the film and b) non-alloyed solder material remains that still melts at a low temperature, at 72.7° C. in the example, the thickness of the applied solder layer is, preferably, limited. The solder material is applied, then, only with a layer thickness that ensures that the entire solder material forms an alloy or a stoichiometric intermetallic compound with the metal of the contact or the metal layer of the film and at least a layer portion of the original metal of the metal layer of the film that adheres to the film remains unchanged. When the solder material melts, the supply of solder material present between the contact of the semiconductor component and the metal layer of the film is, consequently, used up more rapidly than the metal of the metal layer. What is thereby achieved is that the metal layer does not alloy through to the film itself nor does unalloyed solder material remain. The melting point of the material of the connection produced is determined by the lowest melting point of the thermodynamic phases present in the connection zone.

In an exemplary embodiment in which a component is contact-connected to a film with a nickel metal layer having a thickness of 100 nm, a layer of $Bi_{22}In_{78}$ having a thickness of 100 nm can be sputtered onto the contact of the component. The electrically conductive connection is produced within a few seconds in the event of heating to 80° C. and can be subjected to loading up to 650° C.

The further eutectic compositions specified above have the melting points 139° C. ($Bi_{43}Sn_{57}$) and 117° C. ($In_{52}Sn_{48}$). These compositions can be used in each case if the film used can be safely heated a few degrees Celsius above the relevant temperature value. The intermetallic phases BiIn and BiIn$_2$, which are metallic compounds including bismuth and indium in stoichiometric ratios, melt at 109.5° C. and at 89° C., respectively. These are, likewise, temperatures that are still innocuous for customary plastic films. An intermetallic phase affords the advantage that it vaporizes as sole phase at a specific temperature and does not vaporize like a mixture of substances with different vapor pressures of the components contained therein. Therefore, if such an intermetallic phase or stoichiometric composition is used as solder material, it is possible to apply the solder material by electron beam vaporization.

We claim:

1. A method for contact-connecting a semiconductor component to a film provided with a metal layer, which comprises:
    selecting a solder material:
        containing at least two different substances selected from a group consisting of elementary metals and semiconductor materials,
        having a melting point at a temperature at which the film is not damaged, and
        being combinable with a metal to form one of an alloy and an intermetallic compound having a higher melting point than the film;
    disposing the solder material between a contact of the semiconductor component and the metal layer of the film; and
    subsequently causing the solder material to melt, combine with one of a metal of the contact of the semiconductor component and a metal of the metal layer of the film to form one of an alloy and an intermetallic compound having a higher melting point than the film, thereafter solidify, and produce a permanent electrically conducted connection of a material having a melting point higher than the melting point of the disposed solder material.

2. The method according to claim 1, which further comprises selecting a solder material with which, in the melting and solidification step, one of an alloy and an intermetallic compound having a higher melting point is formed with a metal of the metal layer of the film.

3. The method according to claim 1, wherein the solder material, in the melting and solidification step, forms, with a metal of the metal layer of the film, one of an alloy and an intermetallic compound having a higher welting point than the melting point of the solder material.

4. The method according to claim 1, which further comprises utilizing a solder material having a melting point at most 10° C. above a temperature of a eutectic composition of the substances contained in the solder material.

5. The method according to claim 1, which further comprises utilizing a solder material containing bismuth.

6. The method according to claim 1, which further comprises utilizing a solder material of a material selected from a group consisting of:

a composition including bismuth and indium, a composition including bismuth and tin; and a composition including indium and tin.

7. The method according to claim 6, which further comprises utilizing a solder material of a material selected from a group consisting of $Bi_{22}In_{78}$, $Bi_{43}Sn_{57}$, and $In_{52}Sn_{48}$.

8. The method according to claim 1, which further comprises utilizing a solder material of a material selected from a group consisting of $Bi_{22}In_{78}$, $Bi_{43}S_{57}$, and $In_{52}Sn_{48}$.

9. The method according to claim 6, which further comprises utilizing a solder material of a material including one of:

an intermetallic compound of one of BiIn and $BiIn_2$; and a phase of one of BiIn and $BiIn_2$.

10. The method according to claim 5, which further comprises applying the solder material in the disposing step by sputtering the solder material onto one of the contact of the semiconductor component and the metal layer of the film.

11. The method according to claim 6, which further comprises sputtering the solder material onto one of the contact of the semiconductor component and the metal layer of the film.

12. The method according to claim 9, which further comprises applying the solder material in the disposing step by electron beam vaporization onto one of the contact of the semiconductor component and the metal layer of the film.

13. The method according to claim 9, which further comprises utilizing electron beam vaporization to apply the solder material onto one of the contact of the semiconductor component and the metal layer of the film.

14. The method according to claim 1, which further comprises applying the solder material in the disposing step with a layer thickness limited in comparison with a thickness of the metal layer of the film to permit at least a portion of the metal layer of the film to remain unchanged after the melting and solidification step.

15. The method according to claim 1, which further comprises insuring that at least a portion of the metal layer of the film remains unchanged after the melting and solidification step by applying the solder material with a layer thickness limited in comparison with a thickness of the metal layer of the film.

16. The method according to claim 1, wherein the forming of the one of the alloy and the intermetallic compound occurs at a lower temperature than the melting point of the one of the alloy and the intermetallic compound.

* * * * *

UNITED STATES PATENT AND TRADEMARK OFFICE
CERTIFICATE OF CORRECTION

PATENT NO. : 6,773,956 B2 Page 1 of 1
DATED : August 10, 2004
INVENTOR(S) : Holger Huebner et al.

It is certified that error appears in the above-identified patent and that said Letters Patent is hereby corrected as shown below:

<u>Column 5,</u>
Line 32, should read as follows:

-- 10. The method according to claim 6, which further --

Signed and Sealed this

Seventh Day of December, 2004

JON W. DUDAS
*Director of the United States Patent and Trademark Office*